United States Patent [19]

Kinoshita

[11] Patent Number: 4,721,990
[45] Date of Patent: Jan. 26, 1988

[54] MOS TYPE INTEGRATED CIRCUIT HAVING CHARGING AND DISCHARGING TRANSISTORS

[75] Inventor: Hiroyuki Kinoshita, Tokyo, Japan

[73] Assignee: Kabushiki Kaisha Toshiba, Kawasaki, Japan

[21] Appl. No.: 804,622

[22] Filed: Dec. 5, 1985

[30] Foreign Application Priority Data

Dec. 6, 1984 [JP] Japan .................. 59-257928

[51] Int. Cl.[4] ............................. H01L 29/78
[52] U.S. Cl. .................. 357/41; 357/23.4; 357/23.8; 357/23.9; 357/46; 357/90
[58] Field of Search .............. 357/23.8, 23.9, 23.4, 357/41, 46, 90

[56] References Cited

U.S. PATENT DOCUMENTS

| 4,433,257 | 2/1984 | Kinoshita | 357/41 |
| 4,521,448 | 6/1985 | Sasaki | 357/23.9 |
| 4,599,576 | 7/1986 | Yoshida et al. | 357/23.8 |

FOREIGN PATENT DOCUMENTS 114491 8/1984 European Pat. Off. .

OTHER PUBLICATIONS

Ogura, et al., "Design and Characteristics of the Lightly Doped Drain-Source (LDD) Insulated Gate Field-Effect Transistor," IEEE Transactions on Electron Devices, vol. ED-27, No. 8, pp. 1359-1367, Aug. 1980.
IEEE Transactions on Electron Devices, vol. ED-29, 4/82, pp. 590-596.
IEEE Transactions on Electron Devices, vol. ED-30, No. 6, Jun. 1983, pp. 652-657.

Primary Examiner—Edward J. Wojciechowicz
Attorney, Agent, or Firm—Finnegan, Henderson, Farabow, Garrett & Dunner

[57] ABSTRACT

A MOS integrated circuit includes one charging transistor and one discharging transistor. One end of the current path of the charging transistor is connected to one end of the current path of the discharging transistor. A high power voltage is applied to the other end of the current path of the charging transistor. The charging transistor charges the one end thereof to a predetermined voltage level. A low power voltage is applied to the other end of the current path of the discharging transistor. The discharging transistor discharges one end thereof to a predetermined voltage level. Each transistor includes layers of a low impurity concentration for weakening the surface electric field of the transistor, thereby reducing generation of hot electrons or impact ionization current. More hot electrons are generated in the charging transistor than in the discharging transistor. The weakening layers of the discharging transistor has, therefore, an impurity concentration higher than the weakening layers of the charging transistor.

16 Claims, 11 Drawing Figures

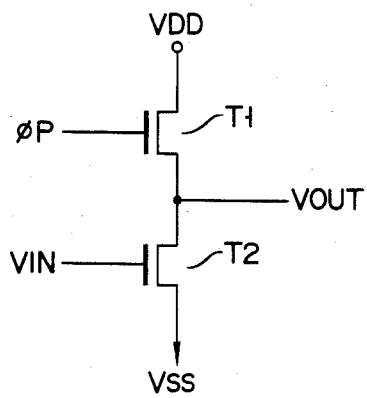
FIG. 3A
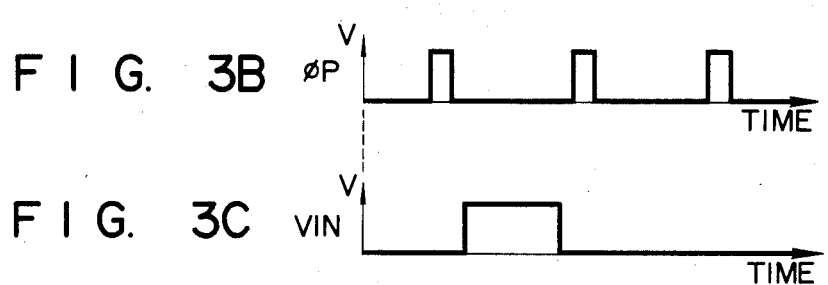
FIG. 3B
FIG. 3C
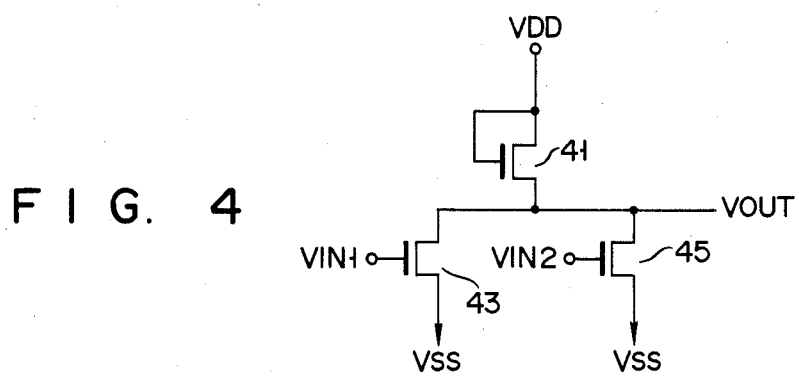
FIG. 4

MOS TYPE INTEGRATED CIRCUIT HAVING CHARGING AND DISCHARGING TRANSISTORS

BACKGROUND OF THE INVENTION

The present invention relates to improvements in MOS integrated circuits each having at least one charging transistor and at least one discharging transistor.

Recently, advances in circuit integrating technology have resulted in increasingly miniaturized MOS transistors. The advancement of the microfabrication technology, however, creates problems, e.g., increase of impact ionization current and injection of hot electrons into the gate oxide film.

It will be explained how impact ionization occurs, and how hot electrons are generated. When a MOS transistor operates in the pentode operating region ($VD \geq VG - VTH$, where VD is the drain voltage of the transistor, VG the gate voltage, and VTH the threshold voltage), its channel fails to reach the drain. Under this condition, a depletion layer is formed between the drain and channel of the transistor. In the case of a miniaturized transistor, the surface electric field at the edge of the drain is extremely intense, and the electrons moving through the channel gain large amounts of energy and become hot electrons. The hot electrons break through a potential barrier of Si—SiO$_2$ and enter a gate oxide film. Some of the electrons form a gate current. Remaining electrons are trapped in the gate oxide film. The longer the MOS integrated circuit is used the more electrons are accumulated in the gate oxide film. The threshold voltage of the MOS transistor varies, and the drive current is reduced. In the worst case, the integrated circuit fails to function correctly.

In the depletion layer formed between the channel and the drain, the hot electrons hit silicon crystals, generating electron-hole pairs. Hence, carriers are multiplied. The resultant holes move through a semiconductor substrate, providing an impact ionization current. The substrate current greatly increases, bringing about undesired phenomena, i.e., a change in the substrate voltage from its design value, and forward biasing of the PN junction.

When the MOS transistor operates in a triode operating region ($VG < VG - VTH$), the depletion layer is not formed between the channel and the drain, and the surface electric field is uniformly distributed. The generation of hot electrons and the increase of the impact ionization current can be restricted.

As mentioned above, when hot electrons and/or impact current is generated, the substrate current increases, the threshold voltage varies, and the drive ability of the transistor is reduced.

A transistor with an LDD (Lightly Doped Drain-Source) structure, has been proposed in which there is no localization of the electric field, and generation of hot electrons and impact ionization current is minimized. In this transistor, N type low doped impurity diffusion layers are formed on the sides of N type highly doped impurity diffusion layers serving as the sources or drains. The LDD transistor is disclosed in Seki, Ogawa, et al., *Design and Characteristics of the Lightly Dooed Drain-Source (LDD) Insulated Gate Field-Effect Transistor*, IEEE ED-27, 1980, pp 1359 to 1367, FIG. 1(a).

In the LDD transistor, an N$^-$ impurity diffusion layer widens the depletion layer in the N region, weakening or attenuating the electric field at the drain end where the field is particularly intense. In this way, hot electron generation is reduced.

The LDD transistor has N$^-$ layers with high resistivity. The LDD transistor can be regarded as having a relatively large equivalent resistor connected between the drain and the source. The equivalent resistor reduces the current flowing between the source and drain by approximately 20%. To compensate for the reduction of current, the channel width of the transistor must be 20 to 30% greater than that of transistors having no N$^-$ layer.

For this reason, the conventional LDD transistor causes many problems. The chip area occupied by the transistors is large, and the chip size is large. Further, increase of the load capacity deteriorates the switching speed of the switching transistors, and power dissipation is increased.

SUMMARY OF THE INVENTION

Accordingly, an object of the present invention is to improve the electrical performance of the MOS integrated circuit having charging and discharging transistors and to reduce the chip size, without any increase in the hot electrons and the impact ionization current.

To achieve the above object, there is provided a MOS type semiconductor integrated circuit having charging and discharging transistors comprising at least one first transistor (T1) having at least one layer (17, 19) for weakening a surface electric field of the first transistor, and a second transistor (T2) of which the current path is connected at one end to one end of the current path of the first transistor, the second transistor having at least one layer (27, 29) for weakening a surface electric field of the second transistor, wherein an impurity concentration of the electric field alleviating layer (27, 29) of the second transistor is higher than that of the electric field weakening layer (17, 19) of the first transistor.

With such an arrangement, the chip area occupied by the discharging transistors minimizes the increase in hot electrons and impact ionization current. The result is reduction of the size of the MOS integrated circuit and improved electrical performance.

BRIEF DESCRIPTION OF THE DRAWINGS

FIGS. 3A to 6 are circuit diagrams of circuits using charging and discharging transistors according to other embodiments of the present invention.

DETAILED DESCRIPTION OF THE PREFERRED EMBODIMENTS

Figure 1:
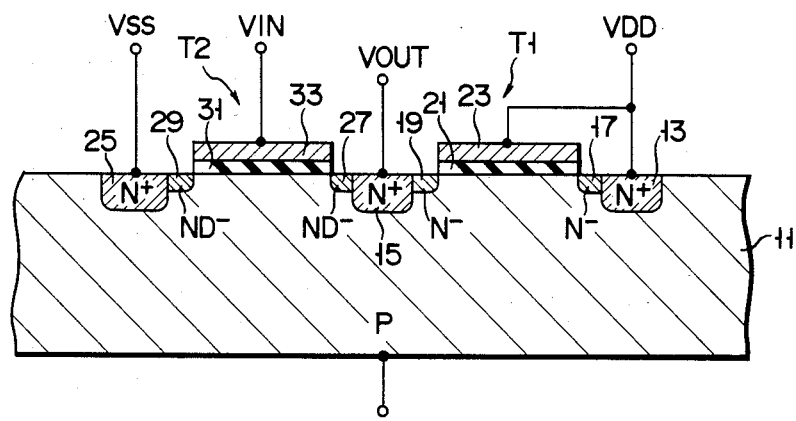
FIG. 1 shows a cross sectional view of an inverter having charging and discharging transistors according to an embodiment of the present invention.

Embodiments of a MOS type integrated circuit according to the present invention will be described referring to the accompanying drawings. FIG. 1 shows an cross section of an inverter of the static type to which the present invention is applied. A schematic illustration of the inverter is given in FIG. 2A. The inverter is made up of transistors T1 and T2.

In the specification, a charging transistor means a transistor which charges a node in a circuit at high voltage (logic "1" level), which is one of two voltages, high or low. A discharging transistor means a transistor which discharges a node in a circuit at low voltage (logic "0" level). The node of the circuit is selectively set to either the first voltage ("0" level) or the second voltage ("1" level) through operation of the discharging and charging transistors. In the circuit shown in FIG. 2A, the charging transistor is transistor T1, and the discharging transistor is transistor T2.

FIG. 1 structurally illustrates an inverter using the charging and discharging transistors, and is for illustrating how the respective semiconductor layers are disposed in and on a semiconductor substrate. Portions unnecessary for explanation of the inverter, such as insulating films, are omitted for the sake of simplicity.

In FIG. 1, an N type highly doped impurity layer (referred to as an N+ layer) 13, which serves as a drain of transistor T1, is formed in the surface region of a P type semiconductor substrate or body 11. An N+ layer 15, which serves as the source of transistor T1, is formed in the surface region of substrate 11, while located away from the N+ layer 13 at a predetermined distance. N+ layer 15 also serves as the drain of transistor T2. N type low doped impurity layers (referred to as N layers) 17 and 19 are formed adjacent to N layers 13 and 15, and located opposite to each other. N− layers 17 and 19 are provided for weakening the surface electric field of MOS transistor T1 (an electric field in the channel of transistor T1, particularly in the vicinity of the drain). The exposed surface of semiconductor substrate 11, which is located between layers 17 and 19, acts as the channel of transistor T2. Insulating film 21 is laid over the channel. Gate electrode 23 is further layered on oxide film 21.

N+ layer 25, which serves as the source of transistor T2, is formed in the surface region of substrate 11, and located away from the N+ layer 15 at a predetermined distance. N type relatively low doped impurity layers (referred to as ND− layers) 27 and 29 are formed adjacent to N+ layers 15 and 25, while being disposed opposite to each other. ND− layers 27 and 29 are provided for weakening the surface electric field of MOS transistor T2 (an electric field of the channel of transistor T1, particularly in the vicinity of the drain). The exposed surface of semiconductor substrate 11, which is located between ND− layers 27 and 29, acts as the channel of transistor T2. Insulating film 31 is laid over the channel. Gate electrode 33 is further layered on the oxide film 31. High power supply voltage VDD is applied to N+ layer 13 and gate electrode 23 of transistor T1. Low power supply voltage VSS is applied to the N+ layer 25. Input signal VIN is supplied to gate 33 of the transistor T2. Output signal VOUT of the inverter is derived from the N+ layer 15.

The source of transistor T1 and the drain of the transistor T2 are integrally formed.

The impurity concentration of N− layers 17 and 19 of the charging transistor T1 is lower than that of ND− layers 27 and 29 of the discharging transistors. The impurity concentration of N+ layers 15, 17 and 25 is $10^{20}/cm^3$, that of N− layers 17 and 19 are $10^{16}$ to $10^{18}/cm^3$, and that of the ND− layers 27 and 29 are $10^{17}$ to $10^{19}/cm^3$.

Figure 2A:
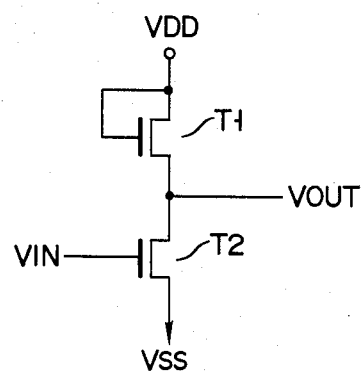
FIG. 2A is a circuit diagram of the inverter of FIG. 1.
Figure 2B:
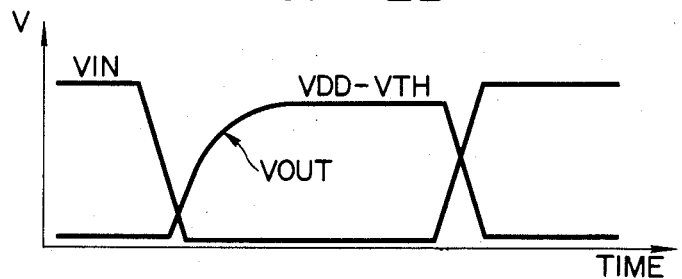
FIG. 2B shows a timing chart for illustrating the operation of the inverter of FIGS. 1 and 2A.

The operation of the inverter as illustrated in FIGS. 1 and 2A will be described with reference to FIG. 2B. When input signal VIN is in logical "1", transistors T1 and T2 are both turned on. The conductance of discharging transistor T2 is much larger than that of charging transistor T1. Output signal VOUT of the inverter, therefore, is a low voltage (logical "0"). When input signal VIN is logical "0", transistor T2 turns off and the node between the transistors T1 and T2, i.e. the output node of the inverter, is charged to a high voltage (logical "1") by transistor T1, so that output voltage VOUT of the inverter is the high voltage. At this time, output voltage VOUT is expressed by VDD−VTH. The reason for this is that the transistor T1 has been set so as to operate in the pentode operating region, and therefore transistor T1 is accompanied by threshold loss.

As shown, drain 13 and gate 23 of the charging transistor T1 are interconnected, causing the transistor to operate in the pentode operating region. With this connection, the surface electric field of charging transistor T1 in the vicinity of its drain has a high field strength.

Discharging transistor T2 operates in a pentode mode in the initial stage of its discharging period so that transistor T2 operates to allow a logical state at the output node of the transistor to change from logical "1" to logical "0". The pentode mode period of transistor T2 is short, however. With progression of the operation of transistor T2, the drain voltage (the inverter output VOUT) of transistor T1 is decreased, and the gate voltage is increased. Then, transistor T2 operates in a triode mode. For this reason, the amount of hot electrons and impact ionization current as generated in discharging transistor T2 is much lower than that in charging transistor T1. This fact implies that most of the gate current and the impact ionization current in the whole MOS integrated circuit are caused by the charging transistors. Consequently, it is not necessary that the impurity concentration of ND− layers 27 and 29 of discharging transistor T2 be equal to that of N− layers 17 and 19 of charging transistor T1.

In the inverter shown in FIG. 1, the impurity concentraction of ND− layers 27 and 29 is set higher than that of N− layers 17 and 19. Accordingly, the resistance of ND− layers 27 and 29 is smaller than that of the N− layers 17 and 19. If discharging transistor T2 is designed to have a conductance equal to that of a conventional inverter, the channel width of transistor T2 may be short. The short channel width permits a reduction in chip size. Consequently, stray capacitance associated with the integrated circuit contained in the semiconductor chip is reduced. The circuit density of the integrated circuit is improved. The switching speed of the switching transistors in the integrated circuit is improved. The power dissipation of the semiconductor circuit is reduced.

Particularly in static type inverters, the voltage of logical "0" is determined by the resistance ratio of charging and discharging transistors T1 and T2. Therefore, the conductance of discharging transistor T2 must be 3 to 20 times that of charging transistor T1. This is why the gate width of the discharging transistor is set 3 to 20 times greater than that of the charging transistor. Most of the chip area occupied by the inverter is the chip area occupied by discharging transistor T2. Consequently, as the inverter of the present embodiment, the gate width of the discharging transistor can be reduced as well as the chip area occupied by the inverter and the resistance of ND⁻ layers 27 and 29.

If the impurity concentration of N layers 17 and 19 is specified to be $10^{17}/cm^3$, the resistance of N⁻ layers 17 and 19 is approximately 0.1 ohm cm. If the impurity concentration of ND⁻ layers 27 and 29 is $10^{18}/cm^3$, the resistivity of the ND⁻ layers is approximately 0.01 ohm cm. If the conductance of this transistor is set equal to that of the corresponding transistor of a conventional inverter, the chip area for the discharging transistors may be reduced by approximately 10 to 20%, although this depends on other factors.

As mentioned, most of the influence by hot electrons arises is caused by the charging transistors. In the present embodiment, only the impurity concentration of the ND⁻ layers is higher than that of the conventional inverter. Thus, according to the MOS type integrated circuit with charging and discharging transistors of the present embodiment, the electrical performance of the MOS integrated circuit may be improved, and the semiconductor chip containing that circuit may be reduced in size.

Also, circuit arrangements, other than the static type inverter, most of the hot electrons are generated by the charging transistors. It is evident, therefore, that the present invention is applicable for various types of circuits, in addition to the aforementioned embodiment. For example, the present invention is applicable for a dynamic type inverter as shown in FIG. 3A. In the figure, charging transistor T1 is connected in series to a discharging transistor T2. Pulse signal $\phi p$, which varies as shown in FIG. 3B, is applied to the gate of transistor T1. Input signal VIN, which varies as shown in FIG. 3C, is applied to the gate of the transistor T2. Output signal VOUT is derived from a node between transistors T1 and T2. Also in this case, an impurity concentration of low doped diffusion layer ND⁻ of transistor T2 is set to be higher than that of low doped diffusion layer ND⁻ of transistor T1.

It is evident, further, that the present invention is not limited to the inverter, but is applicable to any type of MOS type integrated circuit if it has at least one charging transistor and one discharging transistor.

Three embodiments of the present invention will be described in detail.

FIG. 4 shows a circuit arrangement of a known NOR gate. As shown, power source voltage VDD is applied to one end of the current path and the gate of transistor 41. The other end of transistor 41 is connected to one end of the current path of both transistors 43 and 45. Power source voltage VSS is applied to the other ends of these transistors. Initial input signal VIN1 is applied to the gate of transistor 43. The second input signal VIN2 is applied to the gate of transistor 45. The voltage at the node of transistors 41, 43 and 45 is output voltage VOUT of this circuit. In this circuit arrangement, transistor 41 is used as a charging transistor, and transistors 43 and 45 are used as discharging transistors. With this arrangement, the impurity concentration (ND⁻) of the low doped diffusion layers of transistors 43 and 45 is higher than that (N⁻) of the low doped diffusion layer of the transistor 41.

Figure 5:
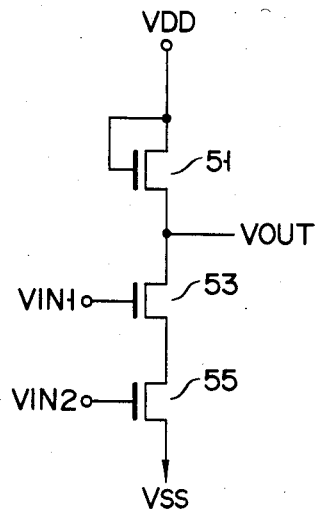

FIG. 5 shows the circuit arrangement of a known NAND gate. Power source voltage VDD is applied to one end of the current path and the gate of transistor 51. The other end of this current path is connected to one end of the current path of transistor 53. The power source voltage is applied to the other end of the current path of the transistor 55. Initial input signal VIN1 is applied to the gate of the transistor 53. The second input signal VIN2 is applied to the gate of transistor 55. The voltage at the node between the transistors 51 and 53 is output voltage VOUT of this NAND circuit. In this circuit arrangement, transistor 51 is used as a charging transistor, and transistors 53 and 55 are used as discharging transistors. With the arrangement, the impurity concentration (ND⁻) of the low doped diffusion layers of transistors 53 and 55 is higher than that (N⁻) of the low doped diffusion layer of transistor 51.

Figure 6:
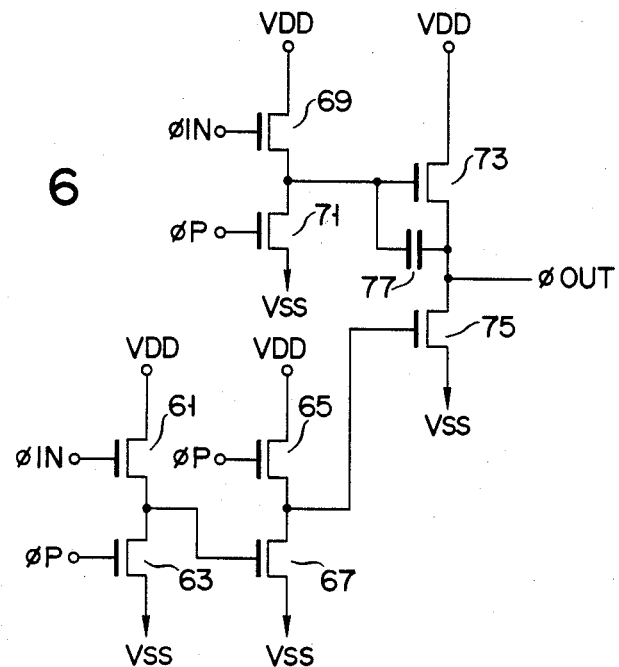

FIG. 6 shows an arrangement of a known dynamic type clock generator. Power source voltage VDD is applied to one end of the current path of transistor 61. The other end of this current path is connected to one end of the current path of transistor 63. The power source voltage is applied to the other end of this current path. Similarly, voltage VDD is applied to one end of the current path of transistors 65, 69 and 73. The other end of the current path of transistors 65, 69 and 73 is connected to one end of the current path of each transistor 67, 71 and 75. Power source voltage Vss is applied to the other ends of transistors 67, 71 and 75. The node between transistors 61 and 63 is connected to the gate of transistor 67. The node between transistors 65 and 67 is connected to the gate of transistor 75. The node between transistors 69 and 71 is connected to the gate of transistor 73. Capacitor 77 is connected between the gate of transistor 73 and the other end of its current path. First clock $\phi$IN is connected to the gates of transistors 61 and 69. The second clock signal IN is supplied to the gates of transistors 63, 65 and 71. Output signal $\phi$ of the clock generator is derived from the node between transistors 73 and 75.

In this circuit arrangement, the transistors 61, 65 and 73 serve as charging transistors, and transistors 63, 67, 71 and 75 as discharging transistors. With this arrangement, the impurity concentration (N⁻) of the low doped diffusion layers of transistors 61, 65, 69 and 73 is higher than that (ND⁻) of the low doped diffusion layer of transistors 63, 67, 71 and 75.

In the circuit arrangement of FIG. 1, low doped impurity layers 17, 19, 27 and 29 lessen the surface electric field are formed from contact with the drains and the sources of the MOS transistors. The low doped impurity layers with lessen the surface electric field formed from contact the highly doped impurity layers serving as the drains of the transistors, as shown FIG. 7. In the figure, similar reference symbols are used for designating like or equivalent portions in FIG. 1 for the sake of simplicity. The features of this embodiment reside in that the low doped impurity layers 19 and 29 in FIG. 1 are not provided, that an N⁻ layer 17 is provided in contact with drain 13 of transistor T1, and that an ND⁻ is provided in contact with drain 15 of transistor T2. This embodiment in which the low doped impurity diffusion layers are formed from contact with the drains of the transistors, can prevent the generation of hot electrons, because the electric field increases in the vecinity of the drain.

Also in such an arrangement, impurity concentration (N⁻) of N⁻ layer 17 of the charging transistor is lower than that (ND⁻) of ND⁻ layer 27 of discharging transistor T2.

Further, when any transistor is used as a transfer gate, two layers of low impurity concentration must be provided at the drain and source of the transistor. This is because the source and drain are reversed, depending on the operation state of the transfer gate.

The present invention is applicable for the MOS integrated circuit of the GDD (Graded Diffusion Drain-Source) structure as well as the MOS integrated circuit of the LDD structure. An embodiment in which the present invention is applied to an inverter composed of MOS transistors with a GDD structure, will be described with reference to FIG. 8. In the figure, similar reference symbols are applied to like or equivalent portions in FIG. 1 for the sake of simplicity. This embodiment is featured in that impurity layers 81, 83, 85 and 87 are provided in place of N type low doped layers 17, 19, 27 and 29, and that impurity layers 81, 83, 85 and 87 cover N+ diffusion layers 13, 15 and 25 serve as drains or sources. The N+ layer 15 is used for both transistors T1 and T2. The low doped impurity layers half cover layer 15. Impurity concentration ND− of layers 85 and 87 is set higher than N− of layers 81 and 83. The GDD structure transistor can also lessen the electric field (surface electric field) near the drain of the transistor, as can LDD structure transistors.

While the aforementioned embodiments of the present invention are constructed using N channel MOS transistors, the present invention is not limited to such embodiments, but is applicable for circuit arrangements based on P channel MOS transistors.

Figure 7:
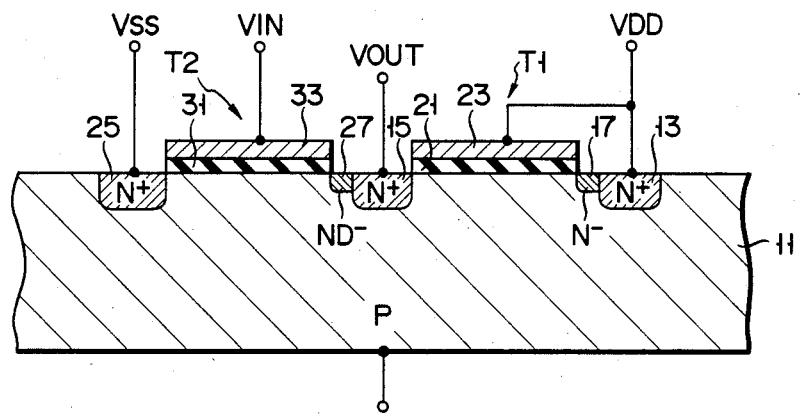
FIGS. 7 and 8 show cross sectional views of inverters using charging and discharging transistors according to additional embodiments of the present invention.
Figure 8:
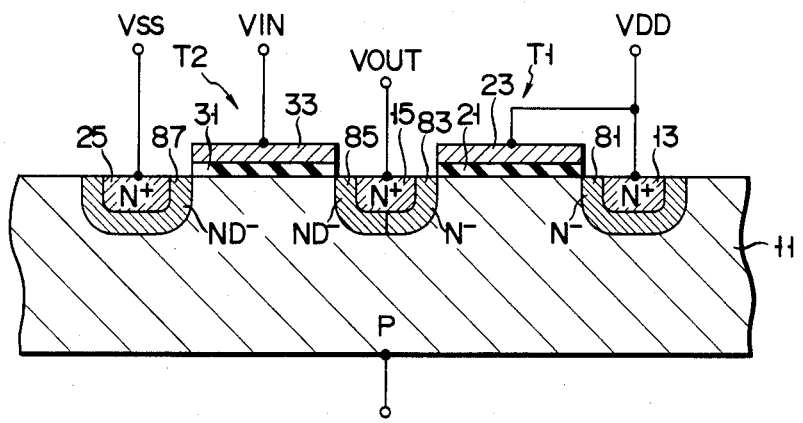

In the circuit arrangements of FIGS. 1, 7 and 8, layer 15 is used for both transistors T1 and T2. It is evident that the present invention is applicable for circuit arrangements in which two or more transistors are individually formed and are connected with one another by an aluminum interconnection.

In the circuits of FIGS. 1, 7, 8, charging transistor T1 is directly connected to discharging transistor T2. This invention is not limited to this. The charging transistor and discharging transistor can be used as transistors 51 and 55 in FIG. 5, and connected through, for example, a transistor, a register, a diode and a capacitor. Hence, the charging transistor relates to the discharging transistor.

What is claimed is:

1. MOS type semiconductor integrated circuit comprising:
    at least one charging transistor including a semiconductor substrate of a first conductivity type, a first layer of a second conductivity type formed in said semiconductor substrate, said first layer serving as a drain, a second layer of the second conductivity type formed in said semiconductor substrate, said second layer serving as a source, and a third layer provided in at least a surface region of said semiconductor substrate and in contact with said first layer, said third layer being of the second conductivity type and having a lower impurity concentration than that of said first layer,
    said charging transistor receiving at one end of its current path a predetermined voltage for charging the other end of the current path substantially to the predetermined voltage,
    at least one discharging transistor including a semiconductor substrate substrate of the first conductivity type, a first layer of the second conductivity type formed in said semiconductor substrate, said first layer serving as a drain, a second layer of the second conductivity type formed in said semiconductor substrate, said second layer serving as a source, and a third layer provided in at least the surface region of said semiconductor substrate and in contact with said first layer, said third layer of said discharging transistor being of the second conductivity type and having an impurity concentration lower than that of said first layer of said discharging transistor, but higher than that of said third layer of said charging transistor,
    one end of the current path of said discharging transistor being coupled to the other end of the current path of said charging transistor, the other end of the current path of said discharging transistor being connected to a predetermined second voltage for discharging the end of the current path of said discharging transistor to said predetermined second voltage.

2. The semiconductor integrated circuit according to claim 1, in which
    said charging transistor includes a fourth layer, said fourth layer being formed in at least the surface region of said semiconductor substrate and in contact with said second layer of said charging transistor, said fourth layer being of the second conductivity type and having an impurity concentration substantially equal to that of said third layer of said charging transistor, and
    said discharging transistor includes a fourth layer, said fourth layer of said discharging transistor being formed in at least the surface region of said semiconductor substrate and in contact with said second layer of said discharging transistor, said fourth layer of said discharging transistor being of the second conductivity type and having an impurity concentration substantially equal to that of said third layer of said discharging transistor.

3. The semiconductor integrated circuit according to claim 1, in which said charging and discharging transistors are MOS transistors with an LDD structure.

4. The semiconductor integrated circuit according to claim 1, in which said charging and discharging transistors are MOS transistors with a GDD structure.

5. The semiconductor integrated circuit according to claim 12, in which
    the impurity concentration of said third layer of said charging transistor is from $10^{16}/cm^3$ to $10^{18}/cm^3$, and
    the impurity concentration of said third layer of said discharging transistor is from $10^{17}/cm^3$ to $10^{19}/cm^3$.

6. The semiconductor integrated circuit according to claim 1, in which
    said first and second semiconductor layers of said charging and discharging transistors have substantially equal impurity concentrations,
    the impurity concentration of said third layer of said discharging transistor is lower than those of said first and second layers of said charging and discharging transistors, and
    the impurity concentration of said third layer of said charging transistor is lower than that of said third layer of said discharging transistor.

7. A MOS type semiconductor integrated circuit comprising:
    at least one charging transistor including a semiconductor substrate of a first conductivity type, a first layer of a second conductivity type formed in said semiconductor substrate, said first serving as a drain, a second layer of the second conductivity type formed in said semiconductor substrate, said second layer serving as a source, and a third layer provided in at least a surface region of said semiconductor substrate and in contact with said first layer, said third layer being of the second conductivity type and having a lower impurity concentration than that of said first layer, and at least one discharging transistor including a semiconductor substrate of the first conductivity type, a first layer of the second conductivity type formed in said semiconductor substrate, said first layer serving as a drain, a second layer of the second conductivity type formed in said semiconductor substrate, said second layer serving as a source, and third layer provided in at least a surface region of said semiconductor substrate and in contact with said first layer of said discharging transistor, said third layer of said discharging transistor being of the second conductivity type and having an impurity concentration lower than that of said first layer of said discharging transistor, but higher than that of said third layer of said charging transistor, one end of the current path of said discharging transistor being coupled to one end of the current path of said charging transistor.

8. The semiconductor integrated circuit according to claim 7, in which said charging transistor further comprises at least one fourth layer formed in at least the surface region of said semiconductor substrate and in contact with said second layer of said charging transistor, said fourth layer being of the second conductivity type and having a lower impurity concentration than that of said second layer of said charging transistor, and said discharging transistor further comprises at least one fourth layer formed in at least the surface region of said semiconductor substrate and in contact with said second layer of said discharging transistor, said fourth layer of the discharging transistor being of the second conductivity type and having a lower impurity concentration than that of said second layer of said discharging transistor.

9. The semiconductor integrated circuit according to claim 7, in which said charging transistor comprises a MOS transistor having an LDD (Lightly Doped Drain-Source) structure, and said discharging transistor comprises a MOS transistor having an LDD structure.

10. The semiconductor integrated circuit according to claim 8, in which said charging transistor comprises a MOS transistor having an LDD structure, and said discharging transistor comprises a MOS transistor having an LDD structure.

11. The semiconductor integrated circuit according to claim 7, in which said charging transistor comprises a MOS transistor having a GDD (Graded Diffused Drain-Source) structure, and said discharging transistor comprises a MOS transistor having a GDD structure.

12. The semiconductor integrated circuit according to claim 8, in which
said charging transistor is a MOS transistor with a GDD structure having said third layer covering said first layer of said charging transistor and having said fourth layer covering said second layer of said charging transistor, and
said discharging transistor is a MOS transistor with a GDD structure having said third layer covering said first layer of said discharging transistor and having said fourth layer covering said second layer of said discharging transistor.

13. The semiconductor integrated circuit according to claim 7, in which the impurity concentration of said third layer of said charging transistor is from $10^{16}/cm^3$ to $10^{18}/cm^3$, and the impurity concentration of said third layer of said discharging transistor is from $10^{17}/cm^3$ to $10^{19}/cm^3$.

14. The semiconductor integrated circuit according to claim 7, in which
said charging transistor receives at the other end of its current path a first predetermined voltage, said charging transistor serving to charge said one end of the current path of said charging transistor to a second voltage equal to or lower than said first voltage, and
said discharging transistor receives at the other end of its current path a third voltage lower than said second voltage, said discharging transistor serving to discharge said one end of the curent path of said second transistor to a fourth voltage equal to or higher than said third voltage but lower than said second voltage.

15. The semiconductor integrated circuit according to claim 7, in which
said first and second layer of both of said charging and discharging transistors have substantially equal impurity concentrations, and
the impurity concentration of said third layer of said discharging transistor is lower than that of said first and said said second layers of said charging and discharging transistors.

16. The semiconductor integrated circuit according to claim 8, in which
said first and second layers of both of said charging and discharging transistors have substantially equal impurity concentrations,
the impurity concentrations of said third and fourth layers of said discharing transistors are lower than that of said first and second layers of said charging and discharging transistors, and
the impurity concentrations of said third and fourth layers of said charging transistors are lower than that of said third and fourth layer of said discharging transistor.

* * * * *